United States Patent
Kane

[19]

[11] Patent Number: 6,166,894
[45] Date of Patent: Dec. 26, 2000

[54] PCB BASED PROTECTOR CARTRIDGE

[75] Inventor: Adam Stuart Kane, Morristown, N.J.

[73] Assignee: Lucent Technologies Inc., Murray Hill, N.J.

[21] Appl. No.: 09/268,237

[22] Filed: Mar. 15, 1999

[51] Int. Cl.[7] ................................................. H01C 7/12
[52] U.S. Cl. ............................................ 361/119; 361/748
[58] Field of Search ................................. 361/117, 119, 361/124, 679, 748, 760, 761, 770, 778, 781, 783, 806; 439/55–58; 379/399, 412; 257/723, 724

[56] References Cited

U.S. PATENT DOCUMENTS

| | | | |
|---|---|---|---|
| 3,798,587 | 3/1974 | Ellis, Jr. et al. | 339/97 |
| 3,947,729 | 3/1976 | Tesch | 361/119 |
| 4,887,183 | 12/1989 | Biederstedt et al. | 361/124 |
| 5,086,368 | 2/1992 | Gerke et al. | 361/118 |
| 5,101,324 | 3/1992 | Sato | 361/783 |
| 5,177,668 | 1/1993 | Lederer et al. | 361/719 |
| 5,299,088 | 3/1994 | Hönl et al. | 361/119 |
| 5,483,409 | 1/1996 | Heidorn et al. | 361/119 |
| 5,595,507 | 1/1997 | Braun et al. | 439/716 |
| 5,596,475 | 1/1997 | Figueiredo et al. | 361/119 |
| 5,627,721 | 5/1997 | Figueiredo et al. | 361/119 |
| 5,996,880 | 12/1999 | Chu et al. | 228/180.21 |

*Primary Examiner*—Josie Ballato
*Assistant Examiner*—Kim Huynh
*Attorney, Agent, or Firm*—Darby & Darby

[57] ABSTRACT

A protector cartridge circuit arrangement which permits more robust line protection. The circuit arrangement has high-capacity and large-sized components staggered across the surface of a printed circuit board such that high-capacity components can be used in the cartridge to protect plural, adjacent lines. Such devices cannot be used in pair-at-a-time protectors because of space constraints. A preferred industrial application is the protection of communication lines.

16 Claims, 4 Drawing Sheets

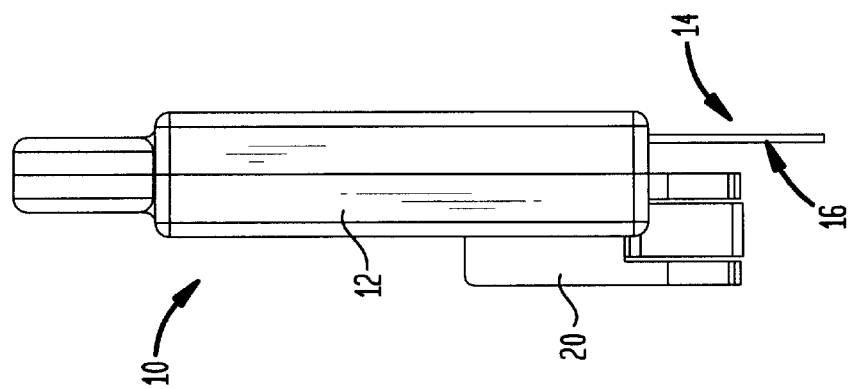
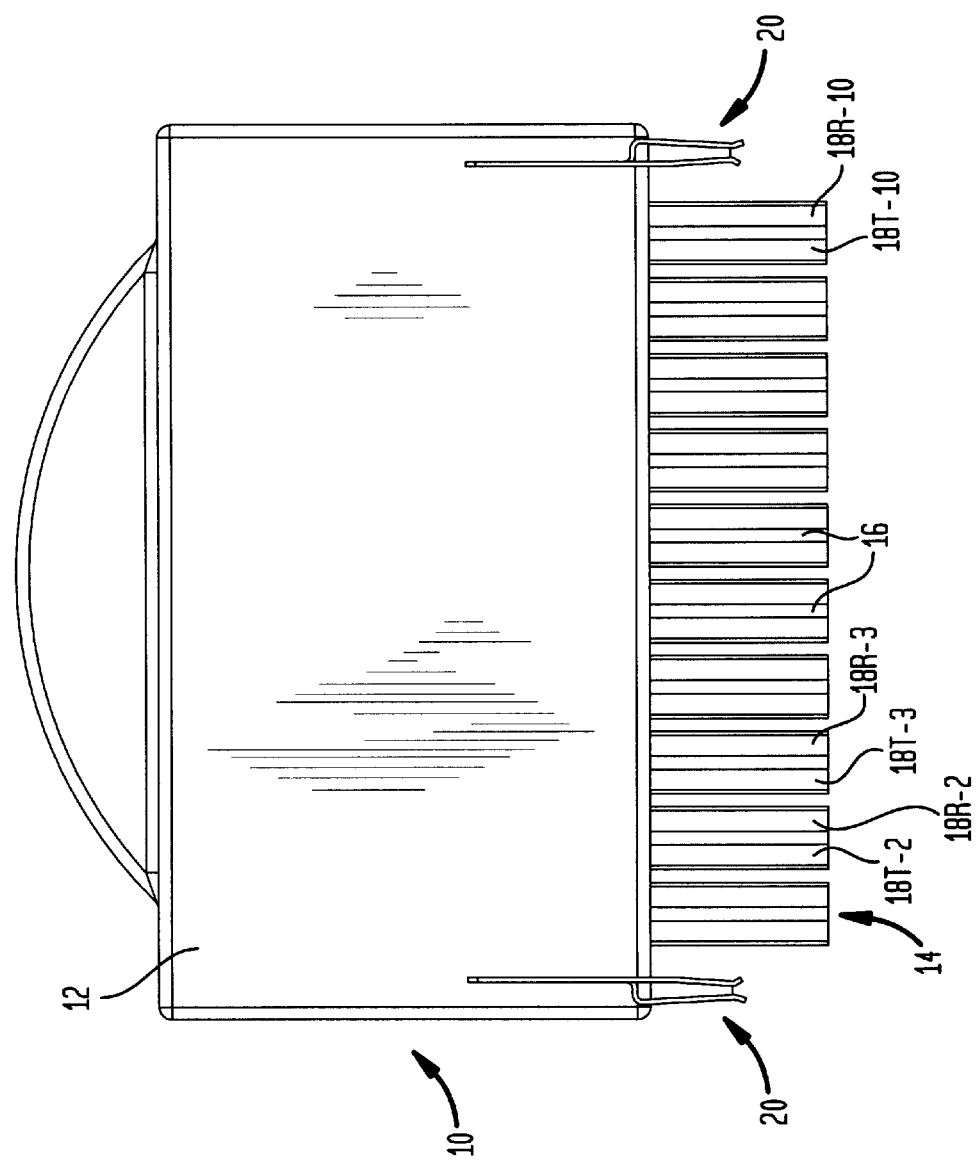

PCB BASED PROTECTOR CARTRIDGE

FIELD OF THE INVENTION

The present invention relates to protector circuits of the type that may be used with telephone circuits, and, more particularly, relates to a protector cartridge circuit arrangement having robust protective circuitry for high-density connection systems.

BACKGROUND OF THE INVENTION

Cartridge protectors for modular connector blocks are known in the art, for example, from U.S. Pat. No. 5,627,721. The individual pairs of telephone circuit wires, for example, are frequently terminated in telephone company central offices and customer premises utilizing multi-terminal connector blocks. Once terminated, these telephone circuit wires, usually comprised of narrow gauge insulated copper cables, are grouped and then rerouted for appropriate distribution of the calls that they carry. Single connector blocks normally accommodate anywhere from sixty to one-hundred pairs of densely packed terminations, wherein multiple connector blocks are frequently contained in close proximity at a single location, for example, one wall of a telephone switching room. Efficient utilization of mounting space is thus required because space within utility locations is traditionally at a premium.

Protective circuitry is a typical accessory circuit that may be connected to the connector blocks. In the art of telecommunications equipment, for example, it is known to provide protective circuits to protect delicate circuitry, including line cards, switching circuits, multiplexers and the like at a central office or other location from overload conditions that may result, for example, from a lightning strike or fallen high-voltage line.

In a conventional manner, a protective circuit in the form of a cartridge or pair-at-a-time module is mounted within a slot of the connector block which may be associated with one or more communication lines. The mounted protector circuit is inserted in the communication circuit, typically between the contacts of opposing IDC connectors to thereby interpose the protective circuit on an unprotected side of the line. The protector circuit provides a ground path during an overload condition to protect the telecommunication circuit.

It is generally desirable to provide a protective circuit which can withstand transient energy strikes, e.g., due to lightning. A greater ability to withstand momentary overload conditions results in fewer service calls to inspect, reset, or replace components on the line. Overload protection is typically configured to protect against over-voltages and over-currents (sometimes referred to as "sneak" currents).

Unfortunately, the capacity of voltage overload protection devices is directly related to the size of the device. Thus, a conventional 6 mm (0.236") gas tube overvoltage protector does not have as great a withstand capability as a conventional 8 mm (0.315") protector. The space constraints at the terminal blocks have dictated a lower capacity rating than might otherwise have been desired for a given application. High-density connecting systems such as the high-density Z-IDC connector block provided by Lucent Technologies, Inc. of Murray Hill, N.J., has a 0.300" (<8 mm) spacing between adjacent lines, and so 8 mm gas tubes have not been used in such high-density systems. Instead, such systems have used 6 mm gas tubes, although the 8 mm might have been preferred for a particular application.

The space constraints imposed by the line spacing of the standard connector blocks has restricted the capacity and number of components used in the associated protective circuitry. What is needed in the art and has heretofore not been available is a cartridge protector for a high-density system which overcomes the problems of prior art cartridge protectors. What is further needed in the art and has not heretofore been available is such a cartridge protector which provides a more optimum overload protection within the space constraints imposed by conventional connector blocks.

SUMMARY OF THE INVENTION

The present invention provides a protector cartridge circuit arrangement which permits more robust line protection which has particular advantage when applied to the protection of communication lines, a preferred application. The arrangement has high-capacity and large-sized components staggered across the surface of a printed circuit board ("PCB") such that high-capacity components can be used in the cartridge to protect plural, adjacent communication lines. Such devices cannot be used in pair-at-a-time protectors because of space constraints.

A cartridge in accordance with the invention is of the type which provides protection to a plurality of communication lines when inserted into a connector. The cartridge includes a housing, a PCB and plurality of devices mounted so that adjacent devices are spaced clear of each other in a staggered pattern.

More particularly, a cartridge in accordance with the invention has a PCB disposed within the housing with a surface for mounting components thereon. The PCB further has a connection edge which protrudes from the housing in a first direction. The connection edge has spaced contacts which extend across the edge of the PCB in a second direction which is perpendicular to the first direction. A plurality of devices are mounted on the surface of the PCB so that adjacent devices in the second direction are spaced clear of each other in the first direction. As a result, the devices are staggered across the surface of the PCB.

In preferred forms, the staggered devices may comprise an alternating pattern on surface of the PCB, the devices may comprise gas discharge tubes, and/or the gas discharge tubes may be 8 mm in diameter. In addition, the PCB may support a plurality of positive thermal coefficient ("PTC") resistors, with at least one PTC connectable in series with each of the plurality of communication lines when the cartridge is inserted into the connector. The PTC resistors may also be mounted on the PCB in a staggered pattern, for example 180° out of phase with the devices (e.g., the gas tubes). In addition, other components—active or passive—may be added such as secondary overvoltage varistors, resistors, sidactors, diodes, and the like.

BRIEF DESCRIPTION OF THE DRAWINGS

These and other features and aspects of the invention are described more completely below in conjunction with the appended drawings in which:

FIG. 1 is a front plan view of the cartridge of the present invention;

FIG. 2 is a side plan view of the cartridge of FIG. 1;

DETAILED DESCRIPTION OF CERTAIN EMBODIMENTS

Figure 3:
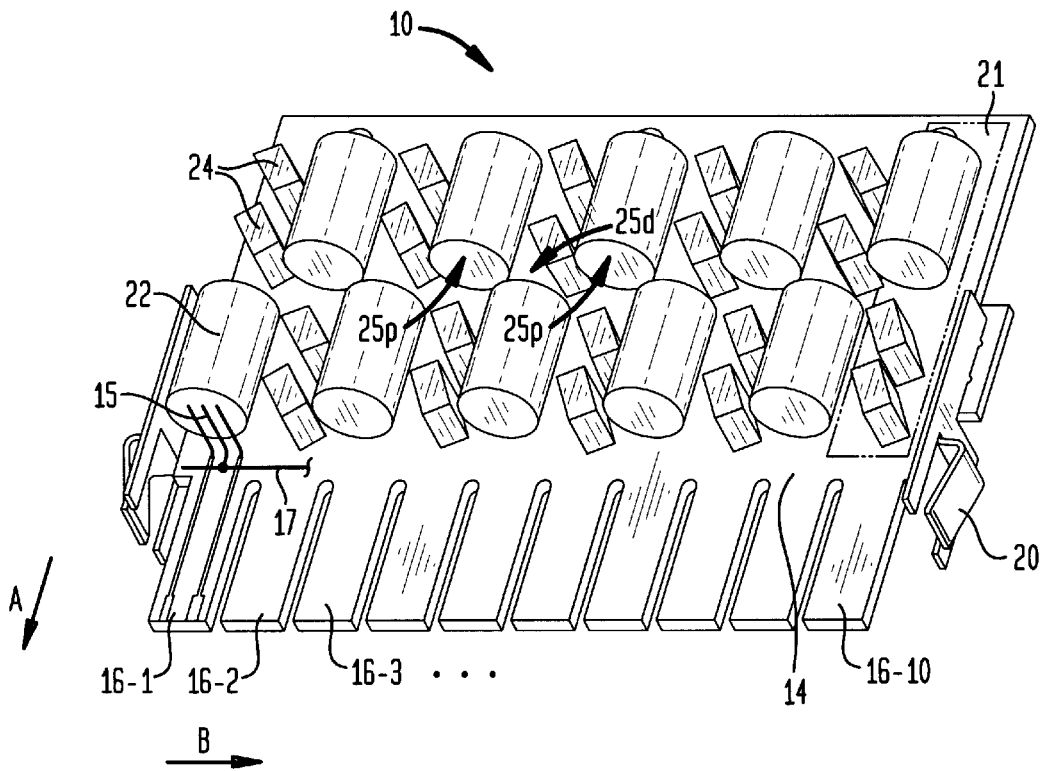
FIG. 3 is a perspective view of the a printed circuit board that may be contained within the cartridge of FIG. 1 in accordance with a preferred embodiment of the invention.

By way of overview and introduction, the cartridge protector of the present invention is configured to be mounted to a standard connector, such as the high-density Z-IDC connector block of Lucent Technologies, Inc. of Murray Hill, N.J. As shown in FIGS. 1 and 2, the cartridge 10 includes a housing 12, a printed circuit board 14 ("PCB") extending therefrom, the PCB terminating in a series of spaced fingers 16, each of which supports a pair of contacts {18T-1, 18R-1}, {18T-2, 18R-2}, ..., {18T-10, 18R-10} through which standard tip and ring connections are made between the cartridge 10 and a connector (not shown). For a complete discussion of connector blocks, see U.S. Pat. No. 3,798,587, the entirety of which is incorporated herein by reference as if fully set forth herein. The contacts {18T-n, 18R-n} are more generally referred to herein as contacts 18.

The cartridge 10 further has external ground clips 20 which engage a grounded mounting bracket (not shown) when the cartridge is mounted to the connector (not shown). For a discussion of the interaction of the ground clips 20 with the mounting frame or bracket, see U.S. Pat. No. 5,595,507 of Braun et al., the entirety of which is incorporated herein by reference as if fully set forth herein.

As an improvement over prior cartridge protectors, the cartridge of the present invention has the protection circuit elements arranged in a manner which permits use of more robust protection circuit devices than prior art cartridges have permitted, while maintaining the standard size and spacing of the fingers 16, namely, a finger width of 0.240" with 0.030" of air or space on either side to establish a uniform 0.300" center-to-center spacing between the fingers 16.

With reference now to FIG. 3, a circuit arrangement in accordance with a preferred embodiment of the cartridge 10 is illustrated. The protector cartridge 10 engages plural communication lines the through the fingers 16 and provides a separate protector circuit 21 for each communication line. By way of contrast, a pair-at-a-time protector circuit engages only one communication line (through the tip and ring contact pair) to protect that single communication line. Each protector circuit 21 includes a first and second device type mounted on the PCB 14 and connected to protect one communication line. The first device type is preferably a gas discharge tube 22 ("GDT") which protects against overvoltages, but may be a solid state device such as a thyristor. The second device type is preferably a positive thermal coefficient resistor 24 ("PTC resistor") two of which are provided to protect against overcurrents in each of the tip and ring connections. Instead of PTC resistors, fuses, thermistors or current sensing elements or circuits may be used. This arrangement (one GDT 22 and two PTC resistors 24) is provided to protect each communication line.

As a departure from prior art protector circuits, the protection devices within the cartridge 10 are arranged on the PCB 14 in a staggered pattern. As shown in FIG. 3, the protector circuit 21 for the odd-numbered fingers 16-1, 16-3, ..., 16-9 have the GDT 22 positioned adjacent the finger 16 and the PTC resistors 24 remote from the finger, whereas the protector circuit for even-numbered fingers are arranged the opposite way, that is, with the GDT 22 positioned remote from the finger and the PTC resistors 24 adjacent the finger. For each successive finger, therefore, the position of the GDTs oscillates between close and remote positions relative to the fingers which protrude from the housing 12 in a first direction (the direction of arrow A).

Importantly, the GDTs are mounted on the PCB 14 at positions such that the GDT of adjacent fingers 16 are spaced clear of each other in the first direction. By this arrangement, and in accordance with a salient aspect of the invention, a GDT having a diameter which exceeds the center-to-center spacing of the finger 16 (0.300") can be mounted on the PCB 14 without interfering with or encroaching on the space required for the protector circuit 21 of an adjacent finger 16. This permits higher capacity GDTs to be selected for use with the protector cartridge 10, for example, an 8 mm tube (0.315") to be used. The additional width of an 8 mm tube in each of the adjacent protector circuits 21 does not impede the mounting or inclusion of other protector circuits 21 because, as one traverses from finger to finger in the direction of arrow B (a second direction which is perpendicular to the aforementioned first direction), the GDTs of adjacent communication lines are clear of each other in the first direction. In other words, the distal end 25d of one GDT is spaced away from the proximal end 25p of adjacent GDTs in the direction of arrow A.

Figure 8:
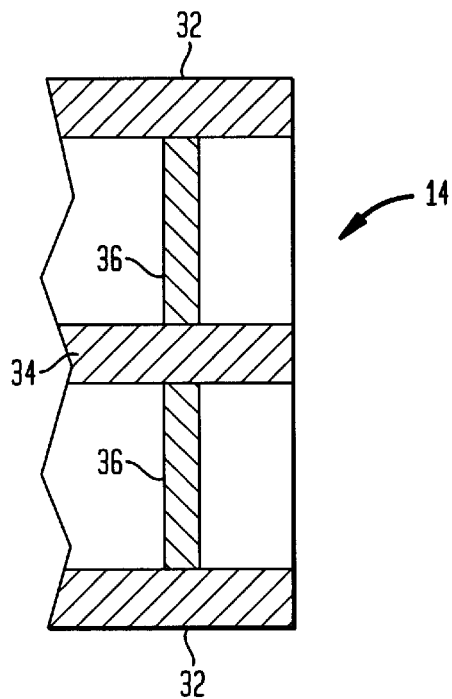
FIG. 8 is a cross sectional view of a printed circuit boards in accordance with an embodiment wherein a ground plane is included in the riddle of the printed circuit board.
Figure 4:
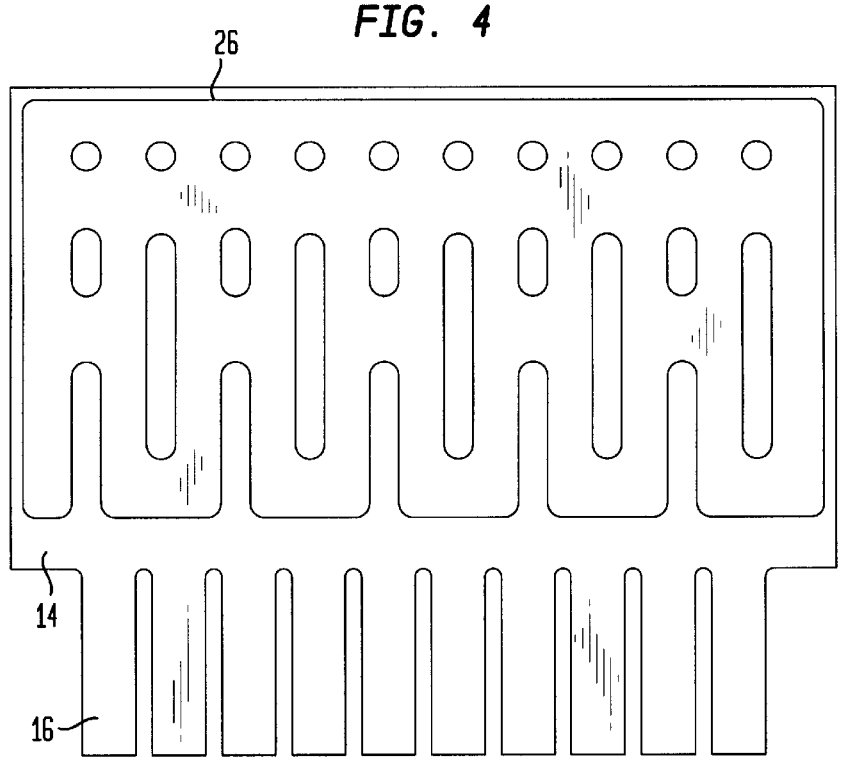
FIG. 4 shows a ground plane that may be provided as a layer or surface of a printed circuit board of FIG. 3.

As understood in the art, each GDT 22 is a three terminal device having two opposing terminals which are connected across the tip and ring connections of each communication line. For each GDT, these terminals are electrically connected to the spaced contacts on a given finger 16 (See e.g., FIG. 3, finger 16-1). A third, central terminal 15 connects the GDT to ground potential, for example, by way of the ground clips 20 and a suitable tracing 17 on the PCB 14. In one implementation of the invention as shown in FIG. 8, the PCB 14 is a multilayered structure with tracings 32 on both sides and a ground plane 34 in the middle. A via 36 connects the central ground plane 34 to the central terminal of each of the GDTs 22 and to the ground clips 20. In another implementation, the PCB 14 comprises abutting double sided PCBs, wherein the tracings on the abutting side of the circuit boards are in electrical contact with each other, each of the GDTs 22 and the ground clips 20 to define a buried ground plane 26, as shown in FIG. 4. Also as understood in the art, the PTC resistors are connected in series with the communication circuit, with one in the tip wire and the other in the ring wire when the cartridge is inserted into the connector. For completeness, it is noted a communication line comprises two wires, commonly referred to as the tip and ring wires.

Figure 5:
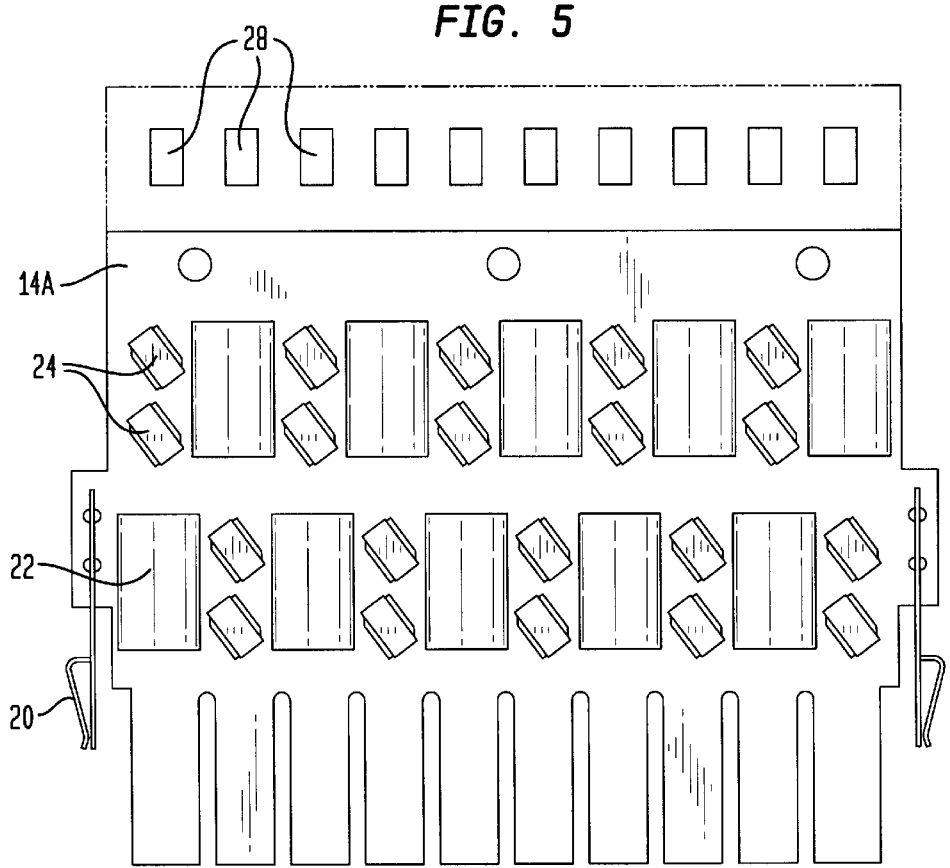
FIG. 5 is a plan view of the printed circuit board of FIG. 3, modified to show optional further protective circuitry.

The cartridge 10 may include further protective circuitry for protecting each of the communication lines. Such further circuitry may be a metal oxide varistor (MOVs) or sidactor to provide further protection against transients that may be imparted to the communication line. The plan view of FIG. 5, for example, illustrates such further, optional circuit components 28 that may be mounted on printed circuit board 14A. When the components of the further protective circuitry require less space on the PCB 14A in the direction of arrow B (that is, across the fingers) than the center-to-center spacing of the fingers 16, then such circuitry can be accommodated without staggering those components.

In FIG. 3, the staggered pattern defined an alternating arrangement of GDTs 22 and PTC resistors 24, wherein both the GDTs and the PTC resistors are staggered with the staggered patterns of each being 180° out of phase from each other. This arrangement is preferred insofar as it promotes a high packing density of the components on the PCB 14. However, the arrangement of FIG. 6 may be preferred in some applications where there is a lot of heat (both the GDTs and PTC resistors produce heat as well). The arrangement of FIG. 6 has the GDTs arranged in a staggered, alternating arrangement as in FIG. 3; however, the PTC resistors 24 have been positioned remote from the fingers 16 at an opposite edge of the PCB. The resulting arrangement requires a larger PCB 14B but distributes the heat generating components more liberally. Optionally, further components such as the devices 28 can be mounted at the voids 30 where no components are mounted, or distal of the PTC resistors.

Figure 6:
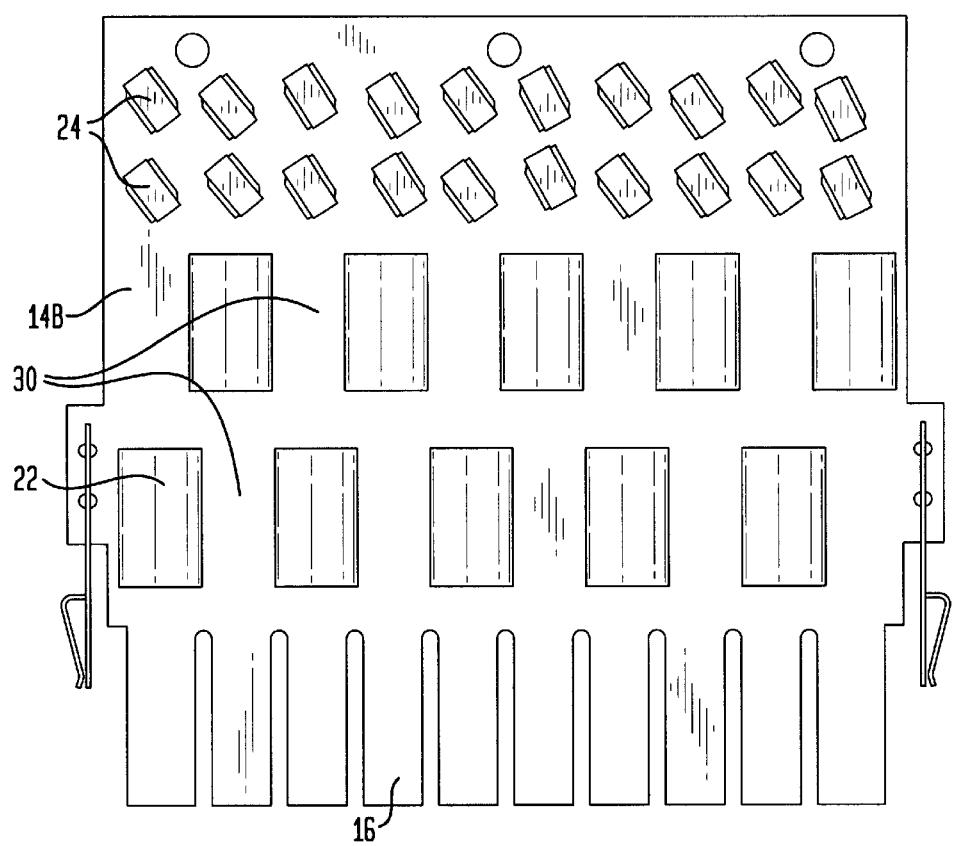
FIG. 6 is a plan view of a printed circuit board in accordance with an embodiment in which the components are more widely spaced.
Figure 7:
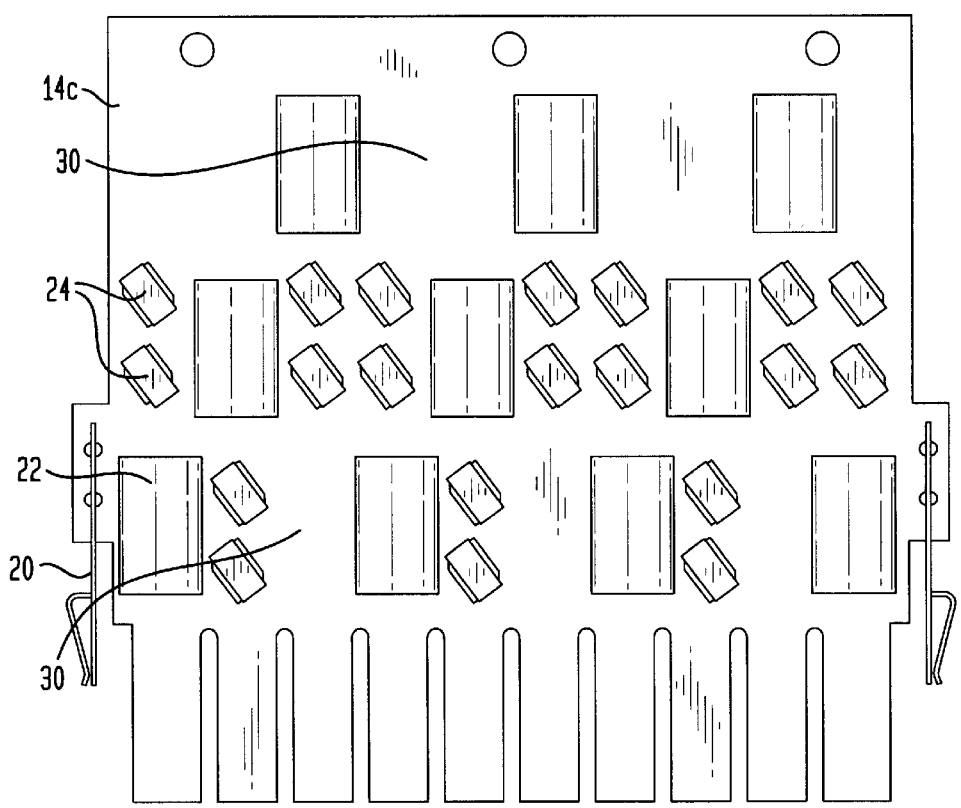
FIG. 7 is a plan view of a printed circuit board in accordance with another embodiment in which the protector devices are staggered in a larger pattern than in the embodiments of the prior figures.

The arrangements of FIGS. 3, 4 and 6 permit direct and relatively short circuit traces to the GDTs which is generally desirable in order to minimize the length of the high-voltage path on the unprotected side of the communication line. In these arrangements, such minimum path lengths are accomplished by positioning the GDTs 22 as close to the fingers 16 as possible. Nevertheless, other arrangements of the GDTs 22 are within the scope of the invention, such as the arrangement of FIG. 7 in which the GDTs 22 are again arranged in a pattern across the PCB 14C, but the pattern repeats every three protector circuits 21 instead of every two protector circuits.

The present invention enables more robust protection to be provided with a cartridge protector. It should be understood, however, that such protection is not feasible with pair-at-a-time protectors, at least not if adjacent communication lines need to be protected; if included in a pair-at-a-time protector, the oversized (0.315") GDT 24 will not permit another pair-at-a-time protector to engage an adjacent communication line due to the 0.300" spacing requirements of typical high-density connector blocks.

The invention is not limited to the use of GDTs, although that is the presently preferred overvoltage protection device. Also features and benefits of the one or more of the embodiments and modifications described above can be used in conjunction with other embodiments disclosed herein and their equivalents.

From the above, it should be understood that the embodiments described, in regard to the drawings, are merely exemplary and that a person skilled in the art may make variations and modifications to the shown embodiments without departing from the spirit and scope of the invention. All such variations and modifications are intended to be included within the scope of the invention as defined in the appended claims.

What is claimed is:

1. A cartridge of the type which provides protection to a plurality of communication lines when inserted into a connector, comprising:
   a housing;
   a PCB disposed within said housing and having a surface for mounting components thereon, said PCB further having a connection edge which protrudes from the housing in a first direction, the connection edge including spaced contacts extending across the edge of the PCB in a second direction which is perpendicular to the first direction; and
   a plurality of devices mounted on the surface of the PCB so that adjacent devices in the second direction are spaced clear of each other in the first direction, whereby the devices are staggered across the surface of the PCB.

2. The cartridge of claim 1, wherein the staggered devices comprise an alternating pattern on surface of the PCB.

3. The cartridge of claim 1, wherein each device is a gas discharge tube.

4. The cartridge of claim 3, wherein the gas discharge tubes are 8 mm in diameter.

5. The cartridge of claim 3, wherein the PCB includes a tracing that is connectable to a ground potential and wherein the gas discharge tubes have a terminal connected to the tracing.

6. The cartridge of claim 5, wherein each gas discharge tube has first, second, and third terminals, the first terminal of each gas discharge tube being commonly connected to the tracing, and the second and third terminals of each gas discharge tube being connectable across a different one of the plurality of communication lines when inserted into the connector.

7. The cartridge of claim 6, wherein the second and third terminals of each gas discharge tube are electrically connected to two of the spaced contacts.

8. The cartridge of claim 1, further comprising a plurality of PTC resistors mounted on the PCB, wherein at least one PTC resistor is connectable in series with each of the plurality of communication lines when the cartridge is inserted into the connector.

9. The cartridge of claim 8, wherein the plurality of PTC resistors are mounted on the PCB in a staggered pattern across the surface of the PCB.

10. The cartridge of claim 9, wherein the staggered patterns of the PTC resistors and the devices are 180° out of phase.

11. The cartridge of claim 9, wherein one of a metal oxide varistor and a sidactor is provided for each of the communication lines.

12. The circuit arrangement of claim 1, wherein each said device is connected across a communication line when the cartridge is inserted into the connector, the contacts establishing an electrical connection with respective ones of the plural communication lines.

13. The cartridge as in claim 1, wherein the PCB is double sided and further includes a ground plane disposed between the two sides of the PCB.

14. The cartridge as in claim 13, wherein the PCB comprises abutting double-sided circuit boards with tracings on each side, the tracings on one side of the abutting circuit boards being in electrical contact with one another.

15. The cartridge as in claim 13, wherein the PCB comprises a multilayer circuit board having the ground plane as an intermediate layer.

16. A cartridge of the type which provides protection to a plurality of communication lines when inserted into a connector, comprising:
   a housing;
   a PCB disposed within said housing and having a surface for mounting components thereon, said PCB further having a connection edge which protrudes from the housing in a first direction, the connection edge including spaced contacts extending across the same edge of the PCB in a second direction which is perpendicular to the first direction; and
   a plurality of first and second protective devices having respective first and second exterior dimensions, mounted on the surface of the PCB so that said first and second protective devices are staggerer relative to one another in both said first and in said second directions across the surface of the PCB.

* * * * *